US010297541B2

(12) United States Patent
Lim et al.

(10) Patent No.: US 10,297,541 B2
(45) Date of Patent: May 21, 2019

(54) MULTIPLE-COMPONENT SUBSTRATE FOR A MICROELECTRONIC DEVICE

(71) Applicant: Intel Corporation, Santa Clara, CA (US)

(72) Inventors: Min Suet Lim, Simpang Ampat (MY); Mooi Ling Chang, Bayan Baru (MY); Eng Huat Goh, Penang (MY); Say Thong Tony Tan, Island Park (MY); Tin Poay Chuah, Bayan Lepas (MY)

(73) Assignee: Intel Corporation, Santa Clara, CA (US)

(*) Notice: Subject to any disclaimer, the term of this patent is extended or adjusted under 35 U.S.C. 154(b) by 22 days.

(21) Appl. No.: 15/355,961

(22) Filed: Nov. 18, 2016

(65) Prior Publication Data

US 2018/0145016 A1 May 24, 2018

(51) Int. Cl.
*H01L 23/498* (2006.01)
*H01L 21/48* (2006.01)
*H01L 23/538* (2006.01)

(52) U.S. Cl.
CPC .... *H01L 23/49833* (2013.01); *H01L 23/5385* (2013.01); *H01L 21/4853* (2013.01); *H01L 23/49816* (2013.01); *H01L 23/49822* (2013.01); *H01L 23/49827* (2013.01); *H01L 23/5386* (2013.01)

(58) Field of Classification Search
CPC ........... H01L 21/4853; H01L 23/49833; H01L 23/49827; H01L 23/49822
See application file for complete search history.

(56) References Cited

U.S. PATENT DOCUMENTS

| | | | | |
|---|---|---|---|---|
| 6,444,499 | B1 | 9/2002 | Swiss et al. | |
| 2004/0124520 | A1 | 7/2004 | Rinne | |
| 2006/0014319 | A1* | 1/2006 | Jeung | H01L 23/3114 438/109 |
| 2009/0121346 | A1 | 5/2009 | Wachtler et al. | |
| 2012/0241980 | A1 | 9/2012 | Ko et al. | |
| 2015/0115424 | A1 | 4/2015 | Riviere et al. | |
| 2015/0325516 | A1* | 11/2015 | Lin | H01L 23/3157 257/774 |
| 2016/0260684 | A1 | 9/2016 | Zhai et al. | |

FOREIGN PATENT DOCUMENTS

KR 1020100071522 6/2010

OTHER PUBLICATIONS

"International Application Serial No. PCT US2017 057224, International Search Report dated Mar. 30, 2018", 3 pgs.
"International Application Serial No. PCT US2017 057224, Written Opinion dated Mar. 30, 2018", 12 pgs.

* cited by examiner

*Primary Examiner* — Tucker J Wright
*Assistant Examiner* — Wilner Jean Baptiste
(74) *Attorney, Agent, or Firm* — Schwegman Lundberg & Woessner, P.A.

(57) ABSTRACT

Microelectronic devices having a multiple-component substrate assembly. A primary supports one or more integrated circuits, and an auxiliary substrate is coupled to, and makes electrical connections with, the primary substrate. The primary substrate will define a pinout for some or all contacts of the integrated circuit, and the auxiliary substrate will provide an additional pinout option. Different configurations of a single primary substrate may be adapted to different applications through use of different configurations of auxiliary substrates.

14 Claims, 9 Drawing Sheets

MULTIPLE-COMPONENT SUBSTRATE FOR A MICROELECTRONIC DEVICE

TECHNICAL FIELD

Embodiments described herein relate generally to microelectronic devices having substrates formed of multiple substrate components coupled to one another, and to methods of forming such multiple-component substrate assemblies.

BACKGROUND

Microelectronic devices such as IC (integrated circuit) packages typically include a substrate to facilitate interconnections between an integrated circuit, referred to herein as a "semiconductor die," and external structures. One purpose of the substrate in such packages is to redistribute the relatively closely-spaced contacts formed on the semiconductor die to a larger pattern of external interconnect contacts (pinout) spread over a greater area of the substrate to facilitate electrical and mechanical attachment, such as through contact balls, to a printed circuit board (PCB) or other structure.

In conventional IC packages, because the package substrate will typically redistribute all contacts of a semiconductor die, the substrate may occupy a relatively large area relative to the area of the semiconductor die. However, for some types of semiconductor die, not all applications will require communication with all contacts of the semiconductor die, and thus the dimension of substrate required to provide external interconnect contacts for all die contacts may be disadvantageous for space-sensitive applications. Additionally, a larger IC package size will normally result in increased cost of the package. In some applications, such as those using die having a high count pinout, redistributing all die contacts to the lower surface of the substrate may require multiple conductor levels in the substrate, further adding both to the cost and the height of the package.

Additionally, the redistributed pattern of the external interconnect contacts may not be optimal for some applications, or for some users in their systems. Some of these disadvantages could be overcome by use of multiple configurations of substrates with each specifically adapted to a specific pinout configuration. However, packaging a specific type of semiconductor die in multiple packages of different sizes and/or pinout configurations can increase overhead for both manufacturing and inventory management.

BRIEF DESCRIPTION OF THE DRAWINGS

in FIG. 1A, an oblique view of the schematic representation of an example multiple-component substrate assembly for a microelectronic device; in FIG. 1B a section of the example multiple-component substrate assembly of FIG. 1A in greater detail; in FIG. 1C, a top view schematic representation of the primary substrate of substrate assembly 100; and in FIG. 1D a bottom view schematic representation of the auxiliary substrate of substrate assembly 100.

FIGS. 2A-B depict alternative configurations of multiple-component substrate assemblies, in which FIG. 2A depicts a schematic representation of a first example configuration; and FIG. 2B depicts a schematic representation of a second example configuration.

DESCRIPTION OF EMBODIMENTS

Figure 1A:
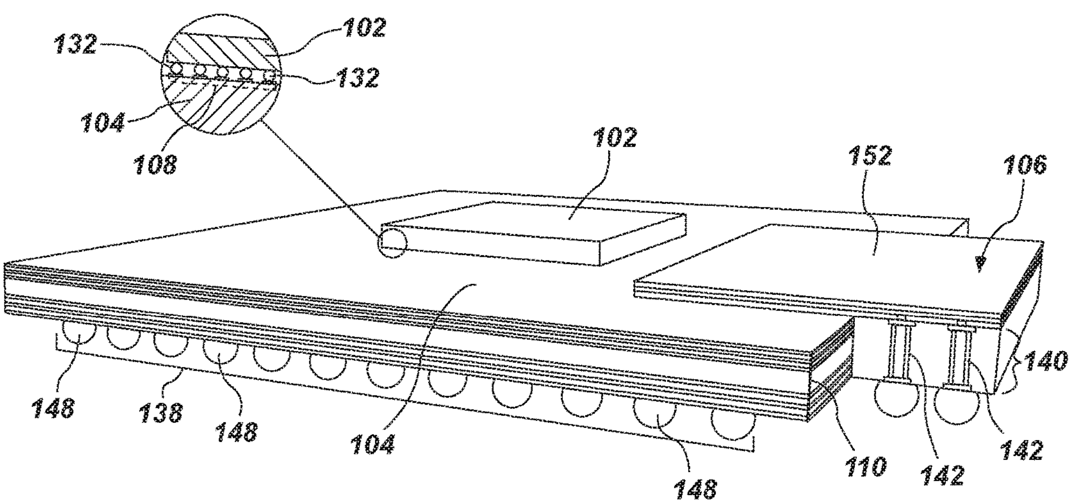
FIGS. 1A-D depict.

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

The present disclosure addresses multiple examples of microelectronic devices utilizing a multiple-component substrate to support one or more semiconductor die on an upper surface. The described examples utilize a primary substrate component to support the semiconductor die, and to provide a basic pinout arrangement for the semiconductor die. The described examples also utilize an auxiliary substrate component configured to couple to the primary substrate component and to provide an additional pinout arrangement for the semiconductor die.

In the examples described herein, the primary substrate component supporting the semiconductor die, in addition to redistributing electrical contacts of the semiconductor die to a pinout on the bottom surface of the primary substrate, will also redistribute some electrical contacts of the semiconductor die to contacts formed at the upper surface of the primary substrate component. In some examples, all contacts of the semiconductor die will be redistributed to a pinout on the bottom surface of the primary substrate, but some contacts of the semiconductor die will also be redistributed to the contacts at the upper surface of the primary substrate component. This configuration facilitates optimal flexibility for manufacturing, in allowing certain contacts of the semiconductor die to be redistributed through the contacts on the upper surface and then through the auxiliary substrate to a desired location beyond the primary substrate.

In other example multiple-component substrates, only a portion of the contacts of the semiconductor die will be redistributed to a pinout on the bottom surface of the primary substrate, and the remaining portion of the contacts of the semiconductor die will be redistributed to contacts on the upper surface of the primary substrate, where they may be contacted and redistributed as desired through a suitably configured auxiliary substrate. As just one example application of this type, some forms of semiconductor die may be capable of operating in multiple operational modes. For example, a processor might be operable in a base configuration mode utilizing a single memory channel, but may also be operable in an enhanced configuration mode utilizing a second memory channel. As another example, for some applications, a processor might require only a basic input/output (I/O) interface in a first configuration mode, but also be operable in a second configuration mode wherein access is needed for communication with additional I/O options (such as, for example, with a wireless communication device, or other form of I/O interface, or to different models of chipsets, etc. In these types of situations, allowing the primary substrate to provide pinout for only the basic operational mode allows the primary substrate to be smaller; and redistributing signal paths to and through the auxiliary substrate facilitates the use of multiple configurations of auxiliary substrate to connect the redistributed signal paths and the auxiliary substrate to a desired pinout location and orientation (or in some cases to a location other than the pinout, as will be described later herein).

Figure 1B:
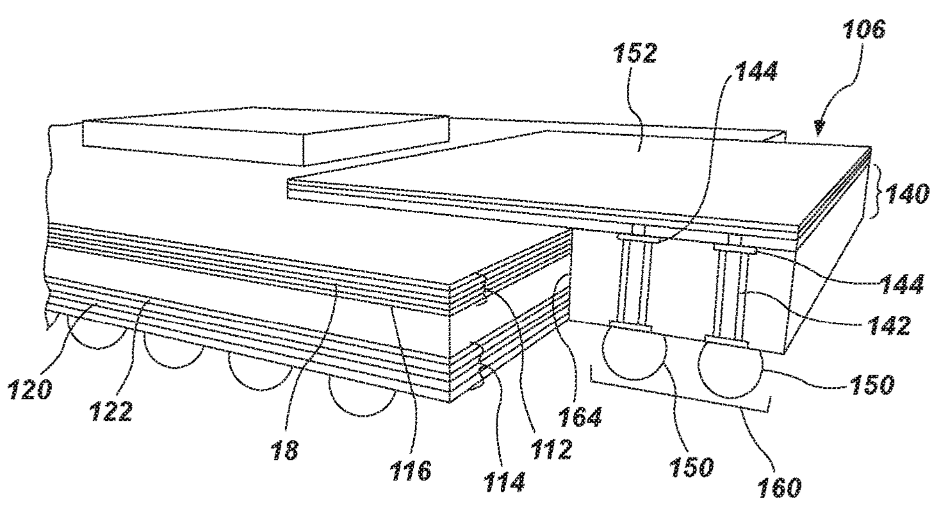
Figure 1C:
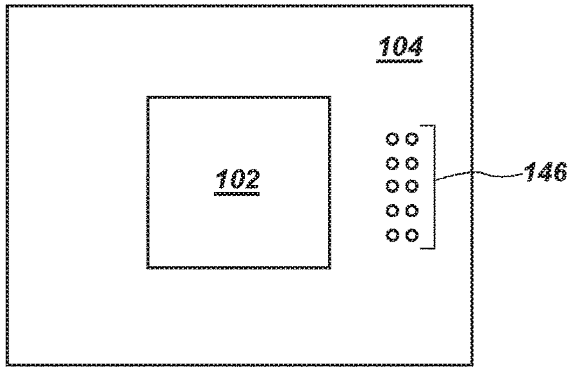
Figure 1D:
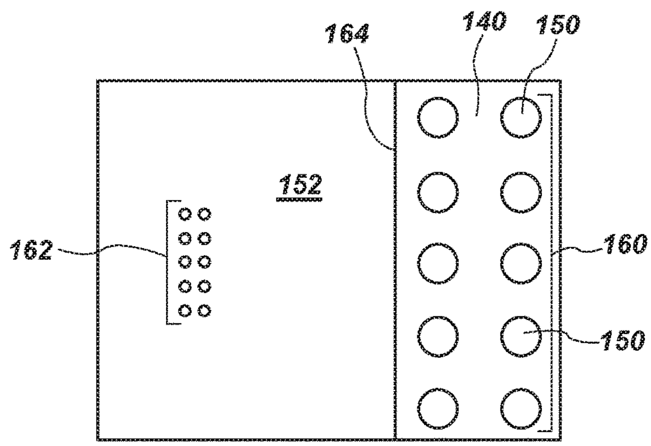

Referring first to FIGS. 1A-D, FIG. 1A depicts an oblique view of an example multiple-component substrate assembly 100 for a microelectronic device; FIG. 1B depicts a section of the substrate assembly 100 of FIG. 1A in greater detail; FIG. 1C depicts the primary substrate 104 of assembly 100 from a top view; and FIG. 1D depicts the auxiliary substrate 106 of assembly 100 from a bottom view. Multiple-component substrate assembly 100 includes a semiconductor die 102 coupled directly to a primary substrate 104. As is well-known in the art, contacts on semiconductor die 102 are bonded to respective contacts of a first group of contacts 108 on the upper surface of primary substrate 104 in a conventional manner. An auxiliary substrate 106 is coupled adjacent one side of primary substrate 104.

The material layers of primary substrate 104 can be any of multiple structures known in the art. In the depicted example, primary substrate may have a central core 110, including a first redistribution structure, indicated generally at 112, extending to a first side of central core 110, and a second redistribution structure, indicated generally at 114, extending to the opposite side of central core 110. Each redistribution structure 112, 114 includes one or more patterned levels of conductive material 116, 118 and 120, 122, for example a metal, in some examples copper or aluminum, that define conductive paths insulated from one another by respective dielectric structures 124, 126 and 128, 130. Primary substrate 104 will include conductive material defining conductive paths extending between redistribution structure 112 and redistribution structure 114. These conductive paths will commonly be in the form of plated through hole (PTH) vias formed in the substrate. Many forms of substrate providing connections between contacts to the semiconductor die on the first surface and a pinout on a second, opposing, surface are known to persons skilled in the art and can be used in primary substrate for such connections.

The conductive traces of upper redistribution structure 112 electrically connect to contacts of the first group of contacts 108 on the primary substrate 104, and thus to contacts 132 on semiconductor die 102 (see inset vertical section view of a representative portion of the primary substrate/semiconductor die interface), and redistribute those contacts to other locations. At least some, and potentially all, contacts of the first group of contacts 108 will be redistributed through redistribution structures 112 and 114 to a second group of contacts 138 at the bottom surface of a primary substrate 104. In many examples, such redistribution will be through PTH vias through central core 110, similar to that depicted at 142 in auxiliary substrate 106 (for clarity of depiction PTH vias are illustrated as if visible at the surface, though as will be recognized by persons skilled in the art they will be located within the exterior surfaces of auxiliary substrate 106). In many examples, such as that depicted, second group of contacts 138 will include contact structures, such as contact balls 148 (also referred to as "solder balls," such term not denoting any specific material for the "balls"). A portion of the contacts of the first group of contacts 108 will be redistributed through redistribution structure 112 to a third group of contacts 146 located on the upper surface of primary substrate 104 (depicted in FIG. 1C). The groups of contacts described herein can be of any of number appropriate for the specific application. In many examples, the contacts will be arranged in an array extending in both X and Y dimensions on the indicated component.

Auxiliary substrate 106 may be of many alternative arrangements of material layers, as described relative to primary substrate 104. In the depicted example, auxiliary substrate 106 includes a core forming a body portion 140 of auxiliary substrate 106. Body portion 140 will typically include multiple generally vertically-extending conductive structures, such as PTH vias, an example of which is indicated generally at 142. PTH vias 142 extend to provide a conductive structure from a contact level 144 at the top of body portion 140 to a fourth group of contacts indicated generally at 160, at the lower surface of the body portion 140. In many examples, the fourth group of contacts 160 will include contact balls 150, often identical to contact balls 148 on the primary substrate 104.

Auxiliary substrate 106 also includes a top portion 152, extending over at least a part of body portion 140, and in many examples over the entirety of body portion 140. Top portion 152, however, also extends beyond at least one side of the body portion 140. Top portion 152 includes a redistribution structure 154. Redistribution structure 154 can be similar to redistribution structures 112 and 114 of primary substrate 104. In some examples, redistribution structure 154 may only require a single conductive material layer (again such as a metal) to define conductive traces extending between a respective PTH via 142 and a contact of a fifth group of contacts 162 on an underside of top portion 152 (depicted in FIG. 1D). The fifth group of contacts 162 is configured on top portion 152 to align with the third group of contacts 160 on the upper surface of primary substrate 104, and to be bonded thereto.

In many examples, the height of the body portion 140 of auxiliary substrate 106 will be selected to generally match the vertical dimension of primary substrate 104. With such structure, body portion 140 may be placed to extend alongside a side of primary substrate 104, and top portion 152 can extend directly along the top of primary substrate 104. The "general matching" of the height of body portion 140 to the vertical dimension of primary substrate 104, includes any adjustment that may be desirable depending upon the specific configuration for the third and fifth groups of contacts (146 and 160, respectively) on primary substrate 104 and top portion 152, and the selected method of bonding respective contacts of each group to one another.

Respective contacts of the third group of contacts 146 may be bonded to contacts of fifth group of contacts 160 through any appropriate mechanism. One example bonding mechanism is anisotropic conductive film (ACF). Anisotropic conductive film includes an adhesive matrix containing conductive particles which facilitate forming conductive paths between opposing contact surfaces during a bonding process. Commonly, with a layer of the ACF between opposing contact surfaces, application of heat and pressure allows the adhesive to flow and establish electrical connections between the contact surface is by trapping the conductive particles. The ACF then cures, providing both a mechanical and electrical connection between the opposing contact surfaces. An example ACF material suitable for the described bonding is Anisotropic Conductive Film Adhesive 7303, sold by 3M Electronics of St. Paul Minn. Other example bonding mechanism include use of solder reflow or solder paste, each as is well-known in the art for forming electrical connections.

FIGS. 1A-B illustrate an advantage of some implementations of the described structure in facilitating the redistribution of traces in communication with the semiconductor die to locations beyond the primary substrate without increasing the overall height of the structure (the "Z-height" of the structure). An example height for semiconductor die of types that would be redistributed through a primary substrate such as that described can be on the order of 370 μm or greater. A redistribution structure including either one or two conductor levels, as may be used for top portion 152 of auxiliary substrate 106, will typically have a Z-height between 50 and 100 μm. An example height of, for example, an ACF film will be on the order of 20 to 75 μm after bonding. As a result, in some example implementations top portion 152 of auxiliary substrate 106 and an example bonding structure can be selected to have a combined Z-height extending above the primary substrate that is less than the Z-height of the semiconductor die. As a result, in such examples, the use of the auxiliary substrate does not increase the Z-height of the IC package.

Figure 2A:
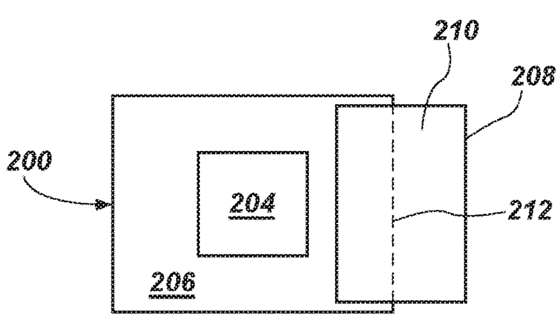
Figure 2B:
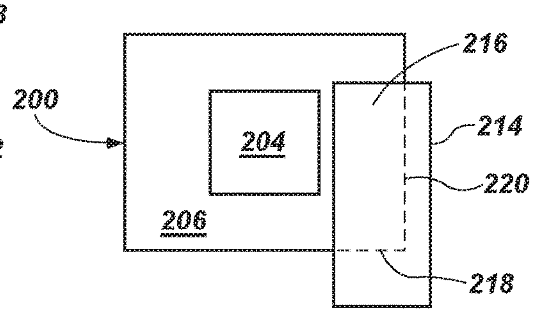

Referring now to FIGS. 2A-B, the figures depict top view representations of alternative multiple-component substrate assemblies 200 and 202, providing different redistributions of contacts from a single configuration of a semiconductor die 204 and associated primary substrate 206. In FIG. 2A, a first configuration of auxiliary substrate 208 allows the body portion to extend beneath top portion 210 to the right of line 212, and thereby redistribute contacts to an "East" quadrant orientation. In FIG. 2B, a second configuration of an auxiliary substrate 214, allows the body portion to extend beneath a top portion 216, at least below (as depicted) line 218, and thereby redistribute contacts to a "South" quadrant orientation. Additionally, in the depicted example, the body portion of auxiliary substrate 214 can extend below top portion 216 to the right of line 220, and therefore also redistribute contacts to the "East" quadrant. In facilitating the depicted alternative substrate assemblies 200 and 202, it should be understood that, in some examples, auxiliary substrates 208 and 214 may contact the same contacts of the third group of contacts on the upper surface of primary substrate 206 (not depicted here but as depicted at 146 in FIG. 1C, and discussed in reference thereto). However, auxiliary substrates 208 and 214 also may contact different sets of contacts in the third group of contacts (146), or at least partially different sets of contacts, such that different contacts of semiconductor die 204 are redistributed by the alternate use of auxiliary substrates 208 and 214.

Figure 3A:
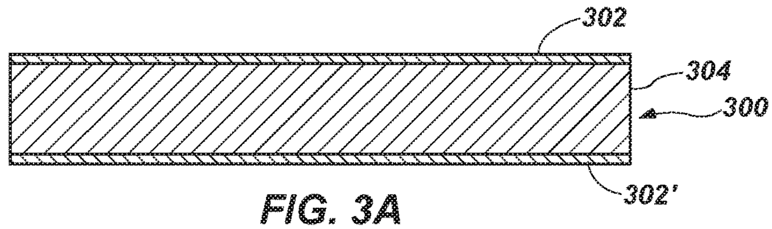
FIGS. 3A-R depict sequential stages of an example process for manufacturing an auxiliary substrate of the type depicted in FIGS. 1A-D.
Figure 3B:
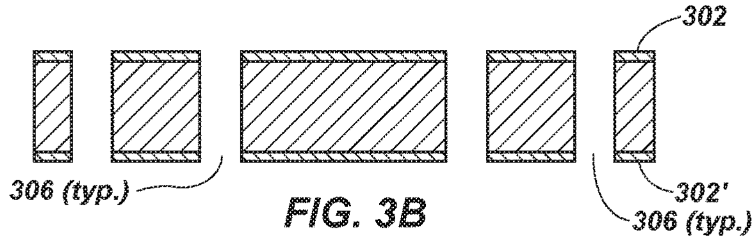
Figure 3C:
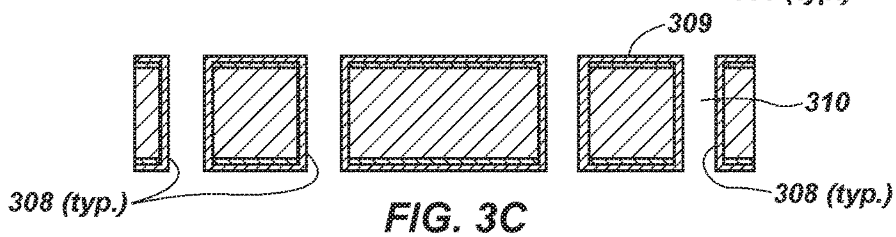
Figure 3D:
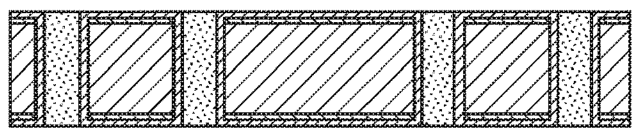
Figure 3E:
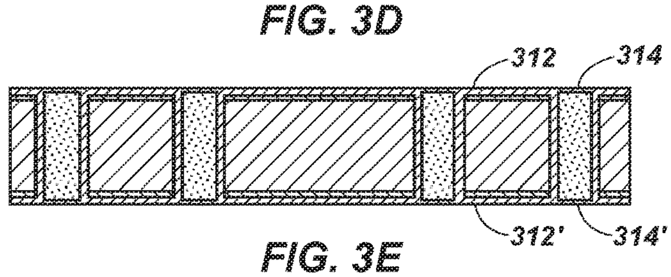
Figure 3F:
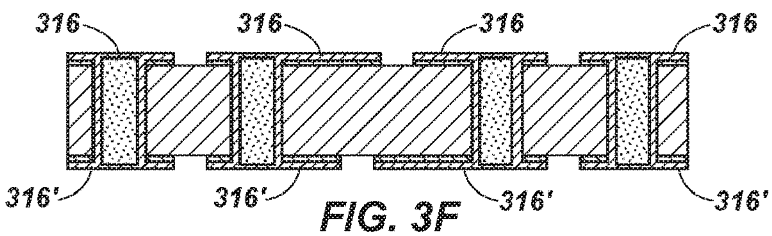
Figure 3G:
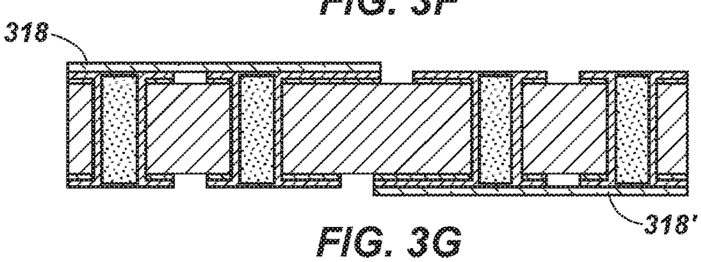
Figure 3H:
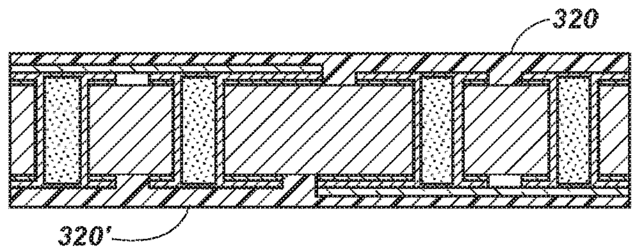
Figure 3I:
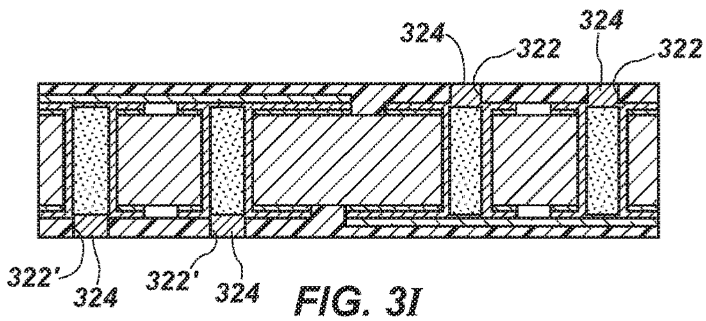
Figure 3J:
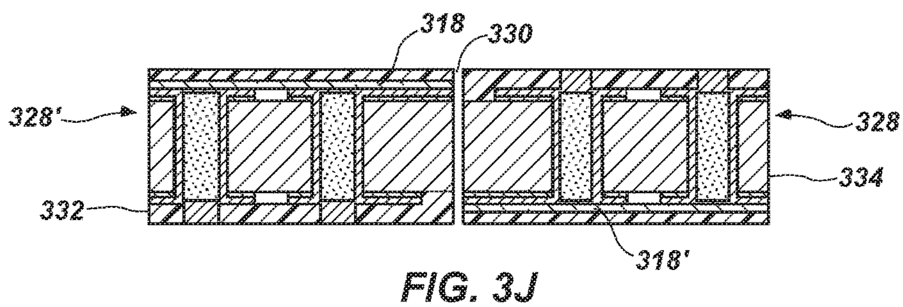
Figure 3K:
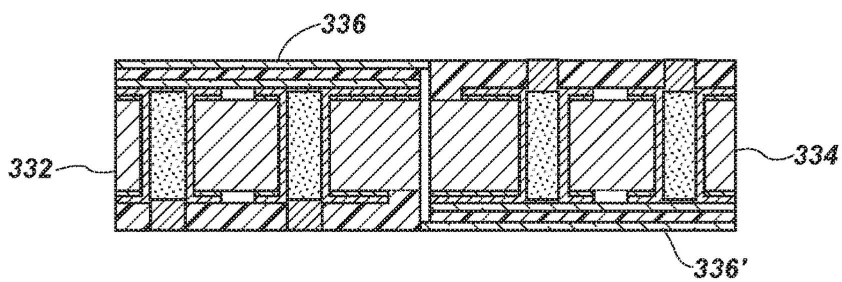
Figure 3L:
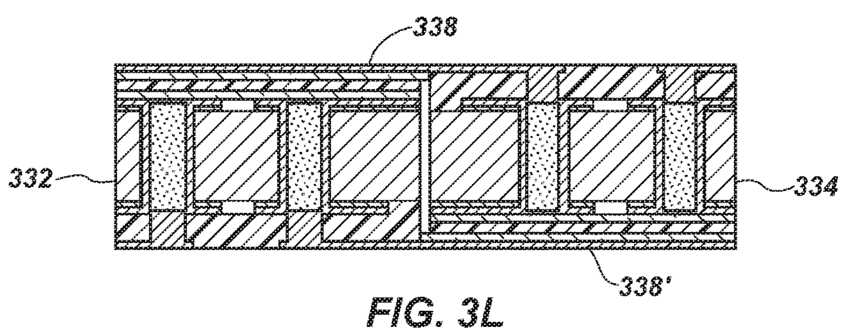
Figure 3M:
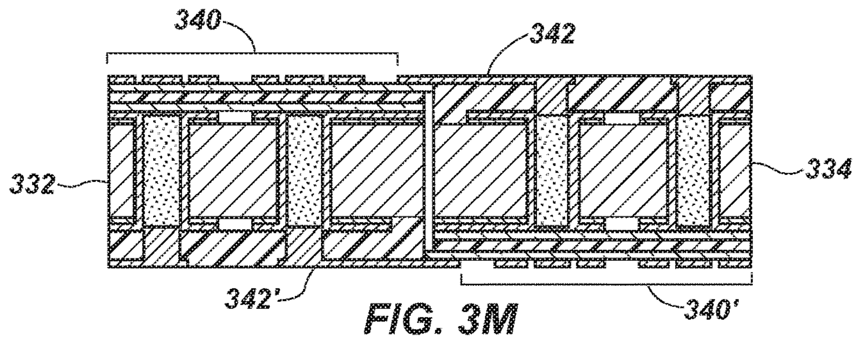
Figure 3N:
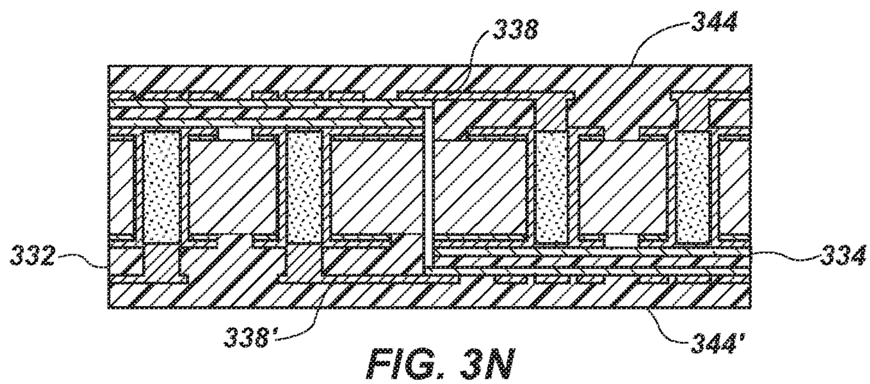
Figure 3O:
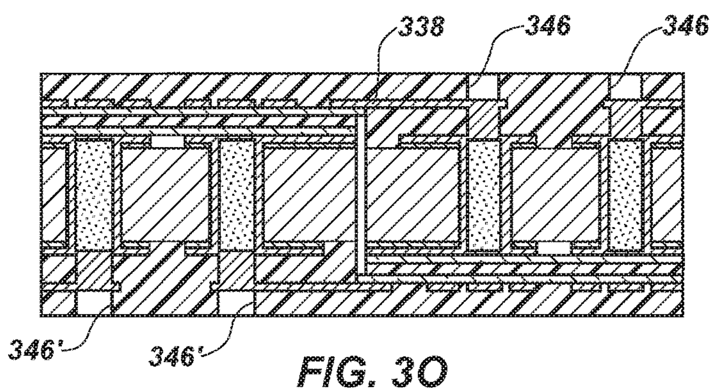
Figure 3P:
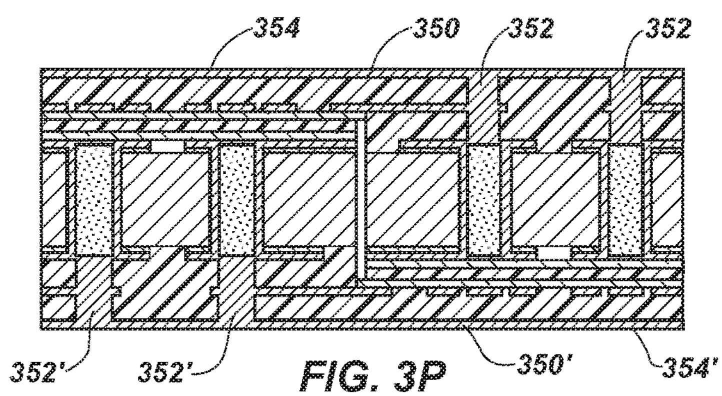
Figure 3Q:
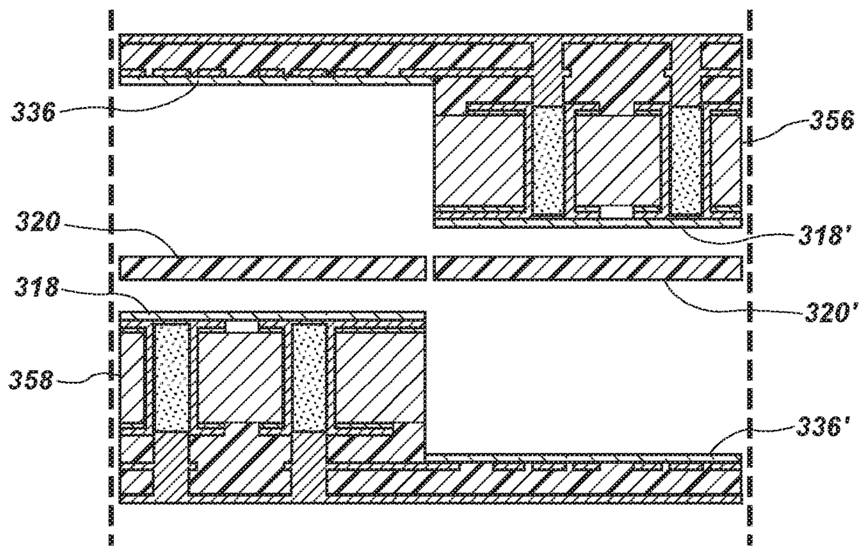
Figure 3R:
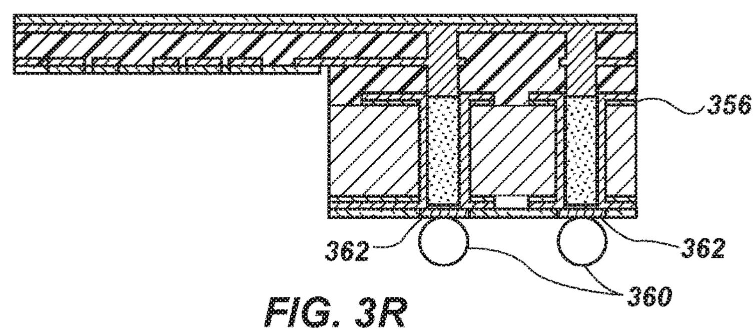

Referring now to FIGS. 3A-R, therein are depicted sequential stages of an example process flow for manufacturing an auxiliary substrate having a structure similar to that of auxiliary substrate 106 of FIGS. 1A-D. Auxiliary substrate 106 can be seen to have a generally L-shaped cross section. The presented process flow minimizes waste in producing auxiliary substrates by forming complementary structures as a single unit and then separating the structures into separate auxiliary substrates. As a result, as will be apparent from the description below two auxiliary substrates can be created within approximately the footprint of a single auxiliary substrate (discounting relatively small additional dimensions needed to allow separation and singulation from other structures, etc.). In the following description, structures will be formed over opposing sides of a substrate core. As a result, corresponding structures on opposing sides will be designated with reference numeral and the same reference numeral prime (i.e., 900 and 900').

FIG. 3A depicts a starting core, indicated generally at 300, having, in this example, copper (Cu) cladding 302, 302' on each side of a central core material 304. For example, in some examples the central core material will include a resin filled, multi-layer glass fiber structure; and copper cladding 302, 302' will be in the form of a copper foil attached to the central core material 304.

Referring to FIG. 3B, holes 306 are drilled to provide via paths for forming PTH vias. Holes may be drilled by any desired method, for example, by laser drilling.

Referring to FIG. 3C, copper plating is formed relative to both sides of substrate 300 to form PTH vias 308, as well as a residual copper layer on both sides of substrate 300. In many examples, a seed layer of copper will be formed by electroless plating or other deposition process, and electroplating will then be used to plate copper to the required PTH wall thickness. In some examples, a material other than copper may be used to form the initial seed layer. In many examples, once PTH vias 308 are plated to the desired dimension, a central aperture 310 will remain.

Referring to FIG. 3D, the central apertures 310 are filled (or "plugged"), with an epoxy or other material that is compatible with the material of core 304, and is suitable to reinforce the material of PTH vias 308.

Referring to FIG. 3E, another copper layer 312, 312' will be deposited to cover the PTH surfaces (i.e. to form a PTH "lid plates" 314, 314'), and patterned connective structures. In many examples, electroless copper plating will again be used to form an initial seed layer, and then electroplating will again be used to plate copper layers 312, 312' to the desired thickness.

Referring to FIG. 3F, copper layers 312, 312' will be patterned, along with residual copper from forming of PTH vias 308 and copper cladding 302 and 302' on core material 304. The described patterning will define conductive traces 316, 316' (typical), some extending to respective PTH vias 308. Additionally, in some examples a dielectric layer may be deposited over patterned conductive traces to fill spaces surrounding the patterned traces 316, 316' before forming of the release layers 318, 318'.

Referring to FIG. 3G, release layers 318, 318' are formed in areas in which the two complementary auxiliary substrate structures will be separated from one another. Release layers 318, 318' will be selected to ease such separation. Suitable materials include high temperature thermal tape, which, in some examples, can be applied over the patterned conductive traces 316. Release layers 318, 318' serve to prevent bonding between later-applied material layers and the portion of the built up substrate that will belong to the other of the complementary auxiliary substrate structures.

Referring to FIG. 3H, dielectric layers 320, 320' will be formed over the sides of the structure. Dielectric layers 320, 320' can include various materials, including polyimide, polyamide, ajinomoto build-up film (ABF), etc. Though depicted as a single level, dielectric layers 320, 320' can include one or more separate material layers.

Referring to FIG. 3I, apertures or other pathways 322, 322' will be formed in dielectric layers 320, 320' and contacts 324, 324' will be formed therein extending to PTH top caps 314, 314' (establishing electrical communication with PTH vias 308) and in some cases extending to other conductive structures, such as conductive traces 316, 316', to establish electrical communication with such structures.

Referring now to FIG. 3J, the built up substrate 328, 328' is routed along a vertical plane 330 to partially divide two complementary substrate structures 332, 334 which will each form the body portion of a respective auxiliary substrate. In some examples, such as that depicted, the vertical plane 330 of the routing will extend between the inner extents of each of complementary release layers 318, 318'.

The routing will extend only for the intended width of the body portions (along a plane extending perpendicularly to the page), and thus the substrate structures are still connected to one another by material layers extending along planes parallel to the surface of the page (and above and beyond the page surface) and to either side of the routing along vertical plane 330 for the specified depth). The described remaining connections between substrate structures 332, 334 facilitate further processing operations as described below. The routing of built up substrate 328, 328' can be by any appropriate methodology, such as for example, laser routing.

Referring to FIG. 3K, additional release layers 336, 336' are formed on each substrate structure 332, 334 extending generally over respective release layers 318, 318'. As noted relative to release layers 318, 318' one example suitable material is high temperature thermal tape. Such tape can be utilized for release layers 336, 336' to extend over the gap defined by routing along vertical plane 330. Extending release layers 336, 336' to cover the gap can provide a support surface to ease subsequent processing, as described below.

Referring to FIG. 3L, metal layers, such as copper layers 338, 338' will be formed extending over both of substrate structures 332, 334. As previously described for forming PTH vias 308, in many examples copper layers 338, 338' will be formed by forming a seed layer of copper electroless plating or another deposition process, and electroplating will then be used to plate copper to the desired thickness. As noted above, in some examples, a material other than copper may be used to form the initial seed layer.

Referring to FIG. 3M, copper layers 338, 338' will be patterned to form contacts, indicated generally by groups of contacts 340, 340'. In some examples, some portions of conductive traces of the top portion of each of the auxiliary substrates may be formed, as indicated generally at 342, 342'. For example, the respective contacts of each group 340, 340' may be redistributed through conductive traces at this level to other locations to facilitate electrical connection to an additional metal layer as will be described below.

Referring to FIG. 3N, the substrate dielectric structure of each top portion will be formed, as indicated at 344, 344'. Dielectric structures 344, 344' can include various materials, including polyimide, polyamide, ajinomoto build-up film (ABF), etc. Dielectric structures 344, 344' can include one or more separate material layers. In examples where ABF is used, the material will be placed over patterned copper layers 338, 338' and formed under pressure to fill around the copper traces and contacts.

Referring to FIG. 3O, vias 346, 346' will be formed extending to selected conductive structures (342, 342') formed from copper layers 338, 338'.

Referring to FIG. 3P, additional copper layers 350, 350' will be formed to form copper contacts 352, 352' in vias 346, 346' as well as copper layers 350, 350'. Copper layers 350, 350' will then be patterned to form conductive traces, as indicated generally at 354, 354'. In many examples these copper structures will be formed by the same processes described earlier herein of forming an electroless copper (or another metal) seed layer followed by electroplating copper.

Referring to FIG. 3Q, the depicted structure will be further separated along each remaining connected side, as discussed earlier herein (i.e., along planes extending parallel to and on opposite sides of the surface of the page, and perpendicular to vertical axis 330). This separation results in singulation of the two auxiliary substrates 356, 358. The separation may be accomplished by laser routing, sawing, etc. The presence of release layers 318, 318', 336, 336' facilitates (as depicted) vertical separation of auxiliary substrates 356, 358 from one another. Once auxiliary substrates 356, 358 are singulated, release layers 318, 318', 336, 336' and remaining material of dielectric layers 320, 320' previously disposed between the release layers may be removed.

Referring to FIG. 3R, auxiliary substrate, 356, 358 may be completed (only one is depicted, as the operations will be the same for both). Contacts of group 360 (corresponding to the contacts 162 in FIG. 1D) will be completed by the forming of bond pads, indicated generally at 362) which will facilitate coupling to contacts on the upper surface of the primary substrate (as depicted at 146 in FIG. 1C). Similarly, another set of contacts (corresponding to the contacts 160 in FIGS. 1A-D), will be formed with BGA bond pads 364. Solder resist layers 366, 368 will then be formed surrounding bond pads 362 and BGA bond pads 364. Contact balls 370 may then be formed on BGA bond pads 364 to complete the fourth set of contacts (160 in FIGS. 1A-D).

Figure 4:
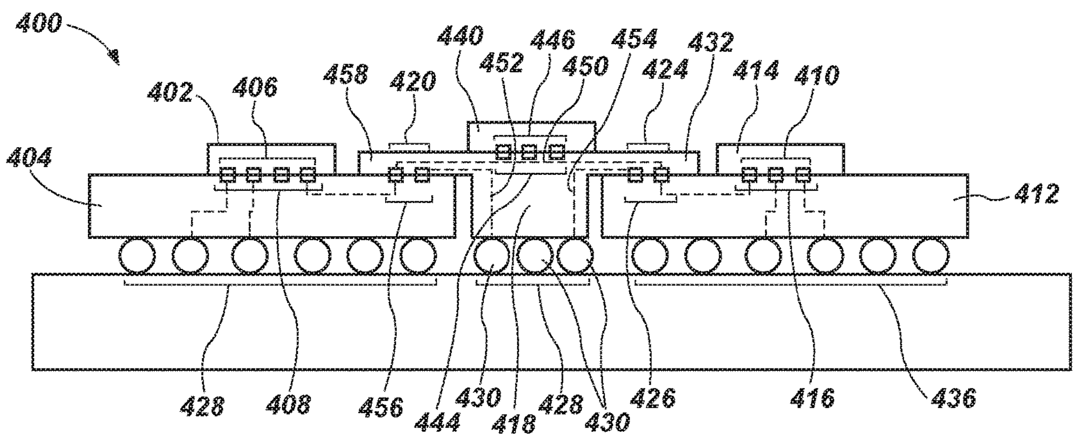
FIG. 4 depicts another example configuration of multiple-component substrate assembly in accordance with the present concepts.

Referring now to FIG. 4, the figure schematically depicts an alternative structure for a microelectronic package 400, which presents multiple optional configurations which may be utilized. These multiple optional configurations will each be described in reference to the depicted structure. As previously described, microelectronic package 400 includes a first semiconductor die 402 coupled to a primary substrate 404, through respective groups of contacts indicated generally at 406 and 408. Primary substrate 404 may be configured in an analogous manner to that of primary substrate 104 depicted in FIGS. 1A-D, and discussed in reference thereto. Microelectronic package 400 also includes a second semiconductor die 410 coupled to a secondary substrate 412, through respective groups of contacts indicated generally at 414, 416, respectively. The term "secondary substrate" does not suggest any relative importance, but is used to distinguish the structure from the primary substrate and auxiliary substrate. Secondary substrate 412 may again be structured in an analogous manner to the first semiconductor die and primary substrate of FIGS. 1A-D, with the exception that secondary substrate 412 will be oriented with contacts 416 oriented on a side facing substrate primary 404.

Microelectronic package 400 then includes an auxiliary substrate 418 that electrically couples to both primary substrate 404 and secondary substrate 412. In this example, auxiliary substrate 418 includes a first extension portion 458 extending over a portion of primary substrate 404, adding includes a second extension portion 432 that extends over a portion of secondary substrate 412. A group of contacts 456 on the upper surface of primary substrate 404 are coupled to respective contacts of a group of contacts, indicated generally at 420, on the underside of the first extension portion 458 of auxiliary substrate 418. Similarly, a group of contacts, indicated generally at 426, at an upper surface of secondary substrate 412 are coupled to respective contacts of a group, indicated generally at 424, on the underside of the second extension portion 432 of the auxiliary substrate 418. In the depicted example, auxiliary substrate 418 also includes a group of external contacts, indicated generally at 428, including contact balls 430 to communicate with a supporting structure 434, such as, for example, a package substrate.

Auxiliary substrate can provide any of various optional forms of connections. In some examples, some or all contacts of group 420 connected to primary substrate 404 may be connected directly through conductive traces and auxiliary substrate 418 to contacts of group 424 coupled to secondary substrate 412. This configuration provides direct communication between the two substrates without requiring the potentially longer signal path communicating through external contacts 428 of auxiliary substrate 418 to external contacts 436 on secondary substrate 412. In other examples, some or all contacts of group 420 coupled to primary substrate 404 may be coupled to external contacts 428 of auxiliary substrate 418. Similarly, in some examples some or all contacts of group 424 of auxiliary substrate 418 coupled to substrate 512 may be coupled to external contacts 428 of auxiliary substrate 418. Accordingly, individual contacts of group 422 on primary substrate 404 and of group 426 on secondary substrate 512 may be connected directly to each other or through external contacts 428.

In some examples, even if auxiliary substrate 418 was being used only to connect contacts of group 422 and group 426 to one another, and no contacts were to be routed to external contacts 428 of auxiliary substrate 418, external contacts 428 in contact balls 430 may still be provided to provide mechanical connection and stability of auxiliary substrate 418.

In another optional configuration, an additional semiconductor die 440 may be coupled to auxiliary substrate 418, through an additional group of contacts 442, on a top surface 444 of auxiliary substrate 418, respectively coupled to a group of contacts 446 on semiconductor die 440. Again, individual contacts of group 442 on auxiliary substrate 418 may be coupled to any of contacts 420, 424 or external contacts 428 of auxiliary substrate 418. Additionally, as will be apparent from this description, another optional configuration would be for an auxiliary substrate such auxiliary substrate 106 of FIGS. 1A-D, to have a set of external contacts on an upper surface, as described relative to auxiliary substrate 418, connected to an attached semiconductor die, such as semiconductor die 440, without the additional presence of a secondary substrate 412 or an attached die 410.

Figure 5:
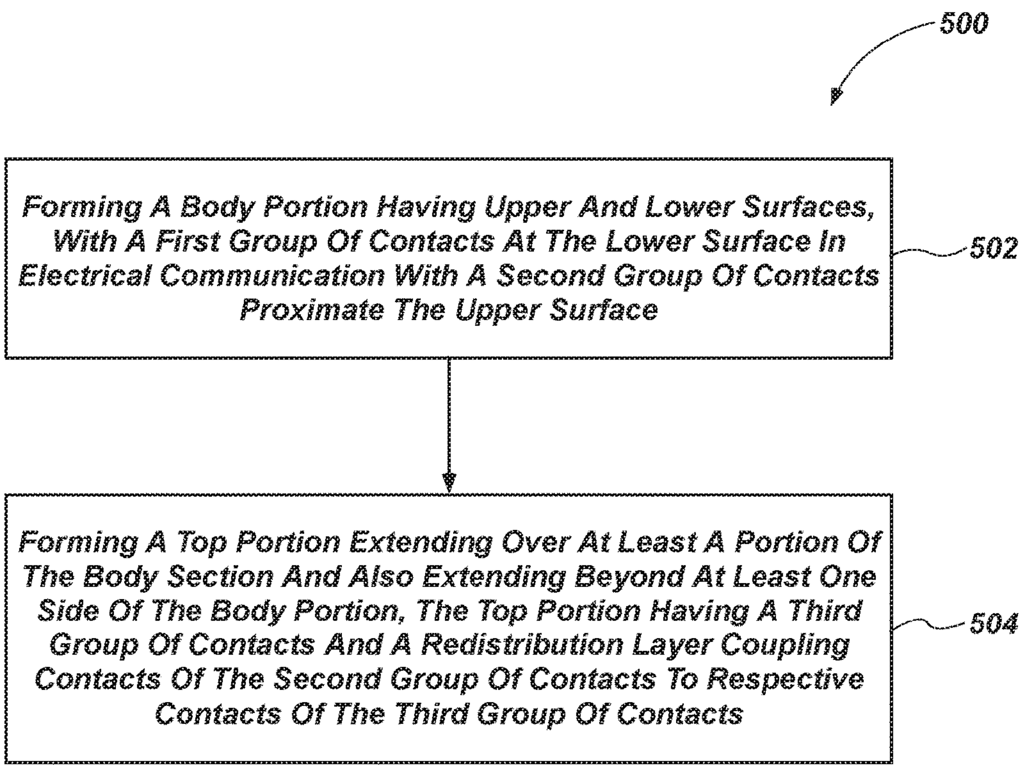
FIG. 5 is a flowchart of an example process for forming an auxiliary substrate.

Referring now to FIG. 5, the figure depicts a flow chart of an example process 500 for forming an auxiliary substrate of the type described elsewhere herein. As indicated at 502, a body portion for the auxiliary substrate is formed with upper and lower surfaces, and with a first group of electrical contacts of the lower surface placed in contact with a second group of contacts proximate the upper surface. As one example process, PTH vias may be formed in the substrate (from an appropriate material, such as copper), deposited in the manner described elsewhere herein. Once the plating for the PTH vias is formed, the interior of the PTH vias may be filled with an epoxy or other selected filler material. Subsequently, the first and second groups of contacts may be formed on the lower and upper surfaces of the body portion, respectively (see, for one example, the corresponding example body portion of FIGS. 1A-B). The first group of contacts will, in many examples, include bond pads supporting contact balls or other bonding structures to facilitate attachment to a supporting structure. In many example processes, however the bond pads will be formed during processing of the substrate, and the contact balls will be formed on the bond pads after processing of the top portion of the auxiliary substrate.

As indicated at 504, a top portion will be formed which extends over at least a portion of the body section and also extends beyond at least one side of the body portion. The top portion includes a third group of contacts and a redistribution layer coupling contacts of the second group to respective contacts of the third group of contacts. In a configuration as depicted herein, the third group of contacts will be formed on a lower surface of the top portion that extends beyond the side of the body portion (see, for one example, the corresponding example configuration of FIGS. 1A-C). The top portion will at least be coupled to the body portion, and may be formed as a single structure with the body portion.

Figure 6:
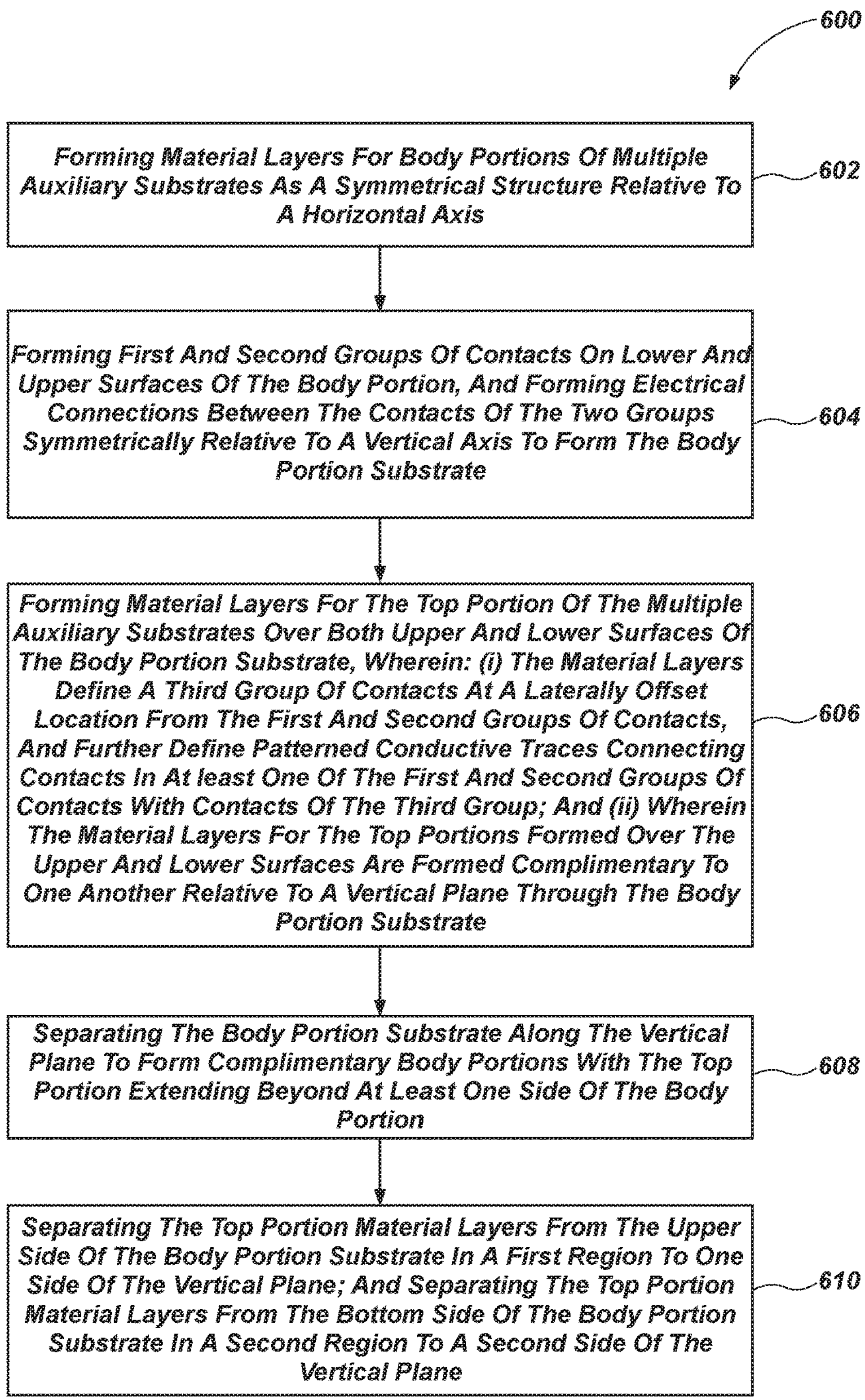
FIG. 6 is a flowchart of another example process for forming one or more auxiliary substrates.

Referring now to FIG. 6, the figure depicts a flowchart of an example process 600 for forming multiple auxiliary substrates as complementary structures, to reduce waste in the manufacturing process. As indicated at 602, material layers for the body portions of multiple auxiliary substrates will be formed as a symmetrical structure relative to a central horizontal axis through the substrate. Expressed in a different way, material layers that will form a part of the body portions of the multiple auxiliary substrates will be formed on both upper and lower surfaces of a central core. The two auxiliary substrates will be complementary to one another, in that though they are formed on opposite sides of a horizontal axis (as depicted) of a central core, once placed in the same orientation, the formed auxiliary substrates will be essentially identical to one another.

As indicated at 604, first and second groups of contacts will be formed on upper and lower surfaces of the body portion, and electrical connections will be formed between respective contacts of the two groups to form the body portion substrate (as depicted in FIGS. 3B-F). The electrical connections between the contacts of the first and second groups may again be by PTH vias formed as described above relative to process 500. Contacts of each of the first and second groups will be formed symmetrically relative to a vertical plane through the body portion substrate.

As indicated at 606, material layers for the top portions of the multiple auxiliary substrates will be formed over both upper and lower surfaces of the body portion substrate (as depicted in FIGS. 3H-P). The material layers for each of the top portions will define a respective third group of contacts at a laterally offset location from contacts of the first and second groups (see FIGS. 3P-R). The material layers also define a pattern of conductive traces connecting contacts in at least one of the first and second groups of contacts with contacts of the third group. In the described structure, the material layers for the top portions, formed over the upper and lower surfaces of the body portion substrate, are formed complementary to one another relative to the vertical plane through the body portion substrate. As a result, in the material layers for the top portion of a first of the auxiliary substrates, the respective third group of contacts will be coupled to contacts of the second group of contacts at the top surface of the body portion substrate (as depicted); and in the material layers for the top portion of a second of the auxiliary substrates, the respective third group of contacts will be coupled to contacts of the first group of contacts at the lower surface of the body portion substrate.

As indicated at 608, the process includes separating the body portion substrate along the vertical plane to form complementary structures to either side of the vertical plane, with the top portion extending beyond at least one side of the respective body portion. In some process flows, such as the flow described relative to FIGS. 3A-R, the body portion substrate will be separated prior to forming of the material layers for the top portion (as shown in FIG. 3J).

As indicated at 610, the process includes separating the top portion material layers from the upper side of the body portion substrate in a first region to one side of the vertical plane, while also separating the top portion material layers from the bottom side of the body portion substrate in a second region to the opposite side of the vertical plane (as shown in FIG. 3Q).

In some example processes the described separation of top portion material layers described at 610 will be facilitated by forming a disposable release layers between the upper and lower surfaces of body portion substrate and the material layers of the top portion on opposite sides of the vertical plane (as depicted in FIGS. 3G and 3K).

As noted earlier, many types of microelectronic devices may benefit from a multiple-component substrate assembly of the type described herein. One example of such a beneficial combination would be a processor coupled to a primary substrate, with an auxiliary substrate coupled to the primary substrate to provide an optional additional pinout to interface with other structures, for example an interposer, a motherboard, etc. In addition, another integrated circuit, such as a memory device, a chipset, a graphics processor, etc., may be coupled either to the auxiliary substrate or to an additional substrate, as described above. The resulting microelectronic device may then be included in a larger electronic device or system.

Figure 7:
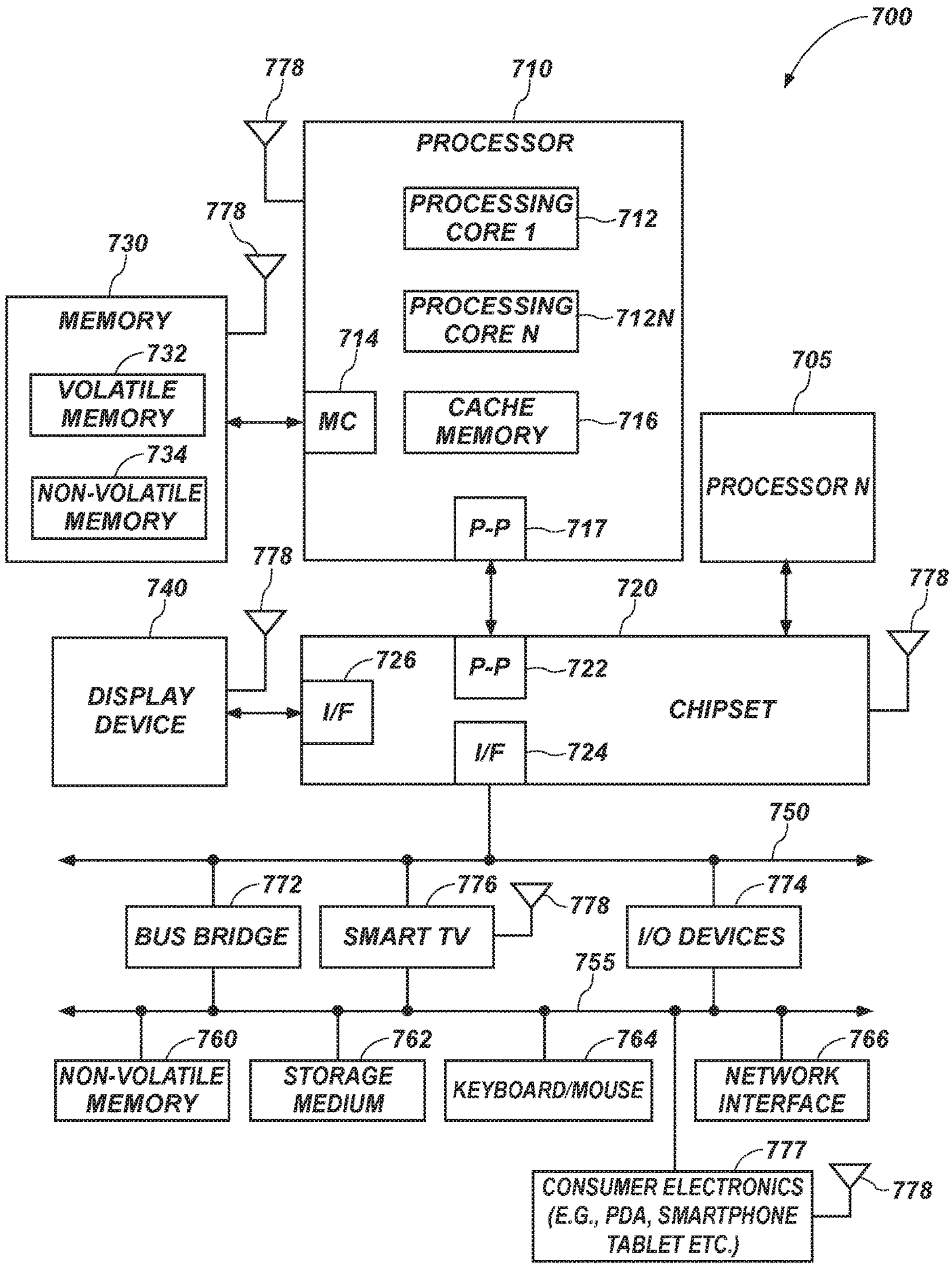
FIG. 7 is block diagram of an electronic system which may incorporate a microelectronic device having a multiple-component substrate as described herein.

FIG. 7 illustrates a system level diagram, according to one embodiment of the invention. For instance, FIG. 7 depicts an example of an electronic device (e.g., system) including the multiple-component substrate assembly as described in the present disclosure. In the context of the electronic system of FIG. 7, the identified processor 710 could be mounted to a primary substrate, and one or more auxiliary substrates could be utilized, for example, to provide a desired pinout for the processor and/or to make connection with another device, such as memory 730 or chipset 720. Alternatively, system components other than the processor 710 could be coupled to a multi-component substrate as described herein.

FIG. 7 is included to show an example of a higher level device application for the present invention. In one embodiment, system 700 includes, but is not limited to, a desktop computer, a laptop computer, a netbook, a tablet, a notebook computer, a personal digital assistant (PDA), a server, a workstation, a cellular telephone, a mobile computing device, a smart phone, an Internet appliance or any other type of computing device. In some embodiments, system 700 is a system on a chip (SOC) system.

In one embodiment, processor 710 has one or more processing cores 712 and 712N, where 712N represents the Nth processor core inside processor 710 where N is a positive integer. In one embodiment, system 700 includes multiple processors including 710 and 705, where processor 705 has logic similar or identical to the logic of processor 710. In some embodiments, processing core 712 includes, but is not limited to, pre-fetch logic to fetch instructions, decode logic to decode the instructions, execution logic to execute instructions and the like. In some embodiments, processor 710 has a cache memory 716 to cache instructions and/or data for system 700. Cache memory 716 may be organized into a hierarchal structure including one or more levels of cache memory.

In some embodiments, processor 710 includes a memory controller 714, which is operable to perform functions that enable the processor 710 to access and communicate with memory 730 that includes a volatile memory 732 and/or a non-volatile memory 734. In some embodiments, processor 710 is coupled with memory 730 and chipset 720. Processor 710 may also be coupled to a wireless antenna 778 to communicate with any device configured to transmit and/or receive wireless signals. In one embodiment, the wireless antenna interface 778 operates in accordance with, but is not limited to, the IEEE 802.11 standard and its related family, Home Plug AV (HPAV), Ultra Wide Band (UWB), Bluetooth, WiMax, or any form of wireless communication protocol.

In some embodiments, volatile memory 732 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. Non-volatile memory 734 includes, but is not limited to, flash memory, phase change memory (PCM), read-only memory (ROM), electrically erasable programmable read-only memory (EEPROM), or any other type of non-volatile memory device.

Memory 730 stores information and instructions to be executed by processor 710. In one embodiment, memory 730 may also store temporary variables or other intermediate information while processor 710 is executing instructions. In the illustrated embodiment, chipset 720 connects with processor 710 via Point-to-Point (PtP or P-P) interfaces 717 and 722. Chipset 720 enables processor 710 to connect to other elements in system 700. In some embodiments of the invention, interfaces 717 and 722 operate in accordance with a PtP communication protocol such as the Intel® QuickPath Interconnect (QPI) or the like. In other embodiments, a different interconnect may be used.

In some embodiments, chipset 720 is operable to communicate with processor 710, 705N, display device 740, and other devices 772, 776, 774, 760, 762, 764, 766, 777, etc. Chipset 720 may also be coupled to a wireless antenna 778 to communicate with any device configured to transmit and/or receive wireless signals.

Chipset 720 connects to display device 740 via interface 726. Display 740 may be, for example, a liquid crystal display (LCD), a plasma display, cathode ray tube (CRT) display, or any other form of visual display device. In some embodiments of the invention, processor 710 and chipset 720 are merged into a single SOC. In addition, chipset 720 connects to one or more buses 750 and 755 that interconnect various elements 774, 760, 762, 764, and 766. Buses 750 and 755 may be interconnected together via a bus bridge 772. In one embodiment, chipset 720 couples with a non-volatile memory 760, a mass storage device(s) 762, a keyboard/mouse 764, and a network interface 766 via interface 724 and/or 704, smart TV 776, consumer electronics 777, etc.

In one embodiment, mass storage device 762 includes, but is not limited to, a solid state drive, a hard disk drive, a universal serial bus flash memory drive, or any other form of computer data storage medium. In one embodiment, network interface 766 is implemented by any type of well known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra Wide Band (UWB), Bluetooth, WiMax, or any form of wireless communication protocol.

While the modules shown in FIG. 7 are depicted as separate blocks within the system 700, the functions performed by some of these blocks may be integrated within a single semiconductor circuit or may be implemented using two or more separate integrated circuits. For example, although cache memory 716 is depicted as a separate block within processor 710, cache memory 716 (or selected aspects of 716) can be incorporated into processor core 712.

To better illustrate the methods and apparatuses described herein, a non-limiting set of example embodiments are set forth below as numerically identified examples:

Example 1 is a microelectronic device, including: a semiconductor die; a primary substrate, the semiconductor die coupled to a first surface of the primary substrate, the primary substrate including a first group of contacts on the first surface engaging contacts of the semiconductor die, and a second group of contacts on the first surface; and an auxiliary substrate coupled to the primary substrate, the auxiliary substrate having a third group of contacts coupled in electrical communication with the second group of contacts.

In Example 2, the subject matter of Example 1 where the primary substrate optionally includes comprises a fourth group of contacts on a second surface opposite the first surface, the fourth group of contacts placed to contact a supporting structure; and wherein the auxiliary substrate comprises a fifth group of contacts on a lower surface, the fifth group of contacts also placed to contact the supporting structure.

In Example 3, the subject matter of any one or more of Examples 1-2, where the auxiliary substrate optionally includes: a first portion extending alongside a generally vertical surface of the primary substrate, and a second portion extending over the first surface of the primary substrate.

In Example 4, the subject matter of any one or more of Examples 1-3, where the auxiliary substrate optionally includes: a body portion having a height essentially matching a height of the primary substrate, and a top portion extending over the body portion and over a portion of the primary substrate.

In Example 5, the subject matter of any one or more of Examples 2-4, where the fourth group of contacts and the fifth group of contacts each optionally include contact balls.

In Example 6, the subject matter of one or more of Examples 2-5, where the supporting structure includes a motherboard, and where the contact balls of the fourth and fifth groups of contacts are placed to contact the motherboard.

In Example 7, the subject matter of any one or more of Examples 1-6, where the second and third groups of contacts are generally planar contacts.

In Example 8, the subject matter of any one or more of Examples 1-7, where contacts of the second and third groups of contacts are electrically coupled to one another through use of an anisotropic conductive film.

In Example 9, the subject matter of any one or more of Examples 1-8, where contacts of the second and third groups of contacts are electrically coupled to one another through use of a solder paste.

In Example 10, the subject matter of any one or more of Examples 1-9, optionally including: a second semiconductor die coupled to a third substrate, the third substrate including a sixth group of contacts on a primary surface; and where the auxiliary substrate further includes a seventh group of contacts coupled in electrical communication with the sixth group of contacts.

In Example 11, the subject matter of any one or more of Examples 1-10, where the auxiliary substrate optionally includes a body portion extending generally alongside the primary substrate and the third substrate, and a top portion extending beyond the body portion and over at least a respective portion of each of the primary substrate and the third substrate.

In Example 12, the subject matter of any one or more of Examples 1-11, where the primary substrate and the third substrate have approximately the same height.

In Example 13, the subject matter of any one or more of Examples 2-12, where the auxiliary substrate defines at least a first conductive path between a contact of the first group of contacts on the primary substrate and a contact of the fourth group of contacts on the auxiliary substrate; and where the auxiliary substrate defines at least a second conductive path between a contact of the fifth group of contacts on the third substrate and a contact of the fourth group of contacts on the auxiliary substrate.

In Example 14, the subject matter of any one or more of Examples 2-13, where the auxiliary substrate defines at least a third conductive path between a contact of the first group of contacts on the primary substrate and a contact of the fifth group of contacts on the third substrate.

In Example 15, the subject matter of any one or more of Examples 1-14 optionally including a second semiconductor die coupled to a fifth group of contacts at an upper surface of the auxiliary substrate; and where the auxiliary substrate further includes a sixth group of contacts, with one or more of the sixth group of contacts coupled in respective electrical communication with contacts of the fifth group of contacts.

In Example 16, the subject matter of Example 15, where the auxiliary substrate defines a conductive path between a contact of the fifth group of contacts on the auxiliary substrate and a contact of the fourth group of contacts on the auxiliary substrate.

In Example 17, the subject matter of any one or more of Examples 15-16, where the auxiliary substrate defines a second conductive path between a contact of the first group of contacts on the primary substrate and a contact of the sixth group of contacts on the auxiliary substrate.

In Example 18, the subject matter of any one or more of Examples 2-17, where at least a portion of the signals routed within the primary substrate to contacts of the first group of contacts are not routed to contacts of the third group of contacts on the primary substrate.

Example 19 is a microelectronic device, including: a first semiconductor die; a primary substrate coupled to the first semiconductor die, the primary substrate having a first group of contacts on the first surface; an auxiliary substrate having a second group of contacts; and means for electrically coupling contacts of the first group of contacts to respective contacts of the second group of contacts.

In Example 20, the subject matter of Example 19 where the means for electrically coupling contacts of the first of contacts to respective contacts of the second group of contacts includes an anisotropic conductive film.

In Example 21, the subject matter of Example 20 where the anisotropic conductive film further establishes a mechanical connection between the primary substrate and the secondary substrate.

In Example 22, the subject matter of any one or more of Examples 19-21, where the auxiliary substrate optionally includes: a body portion extending generally alongside the primary substrate, and a top portion extending over at least a portion of both the body portion and the first surface of the primary substrate.

In Example 23, the subject matter of any one or more of Examples 19-22, where the primary substrate optionally includes a third group of contacts placed to contact a supporting structure external to the microelectronic device, and where the auxiliary substrate optionally includes a fourth group of contacts also placed to contact the supporting structure.

In Example 24, the subject matter any one or more of Examples 19-23, optionally including a second semiconductor die, the second semiconductor die coupled to the auxiliary substrate.

In Example 25, the subject matter of any one or more of Examples 19-24 optionally including another semiconductor die; and a third substrate, and where the another semiconductor die is coupled to the third substrate.

In Example 26, the subject matter of Example 25 where the third substrate optionally includes a fifth group of contacts placed to contact a supporting structure, and a sixth group of contacts at an upper surface; and where the top portion of the auxiliary substrate further extends over the upper surface of the third substrate; and where the top portion of the auxiliary substrate further includes a seventh group of contacts coupled to the sixth group of contacts.

In Example 27, the subject matter of Example 26 optionally includes a third semiconductor die, the third semiconductor die coupled to the auxiliary substrate.

Example 28 is a microelectronic device, including: a semiconductor die capable of multiple operational modes; a primary substrate, the semiconductor die coupled to a first surface of the primary substrate, the primary substrate configured to redistribute contacts from the semiconductor die to other locations, the primary substrate including a first group of contacts on the first surface engaging contacts on the semiconductor die, a second group of contacts on a second surface extending opposite the first surface and configured to engage a supporting structure, the second surface having contacts collectively forming a pinout for a first operational mode of the semiconductor die, and a third group of contacts on the first surface, the third group of contacts associated with a second operational mode of the semiconductor die; an auxiliary substrate coupled to the primary substrate, the auxiliary substrate including, a fourth group of contacts respectively coupled in electrical communication with contacts of the third group of contacts, and a fifth group of contacts respectively coupled in electrical communication with contacts of the fourth group of contacts, and also configured to engage the supporting structure.

In Example 29, the subject matter of Example 28 where the semiconductor die optionally includes a processor.

In Example 30, the subject matter of any one or more of Examples 28-29 optionally including a second semiconductor die coupled in electrical communication with contacts on the auxiliary substrate.

In Example 31, the subject matter of Example 30 where the second semiconductor die is coupled to the auxiliary substrate.

In Example 32, the subject matter of any one or more of Examples 30-31 optionally including a third substrate, and where the second semiconductor die is coupled to the third substrate.

In Example 33, the subject matter of Example 32 where the third substrate includes contacts adapted to engage the supporting structure.

In Example 34, the subject matter of any one or more of Examples 28-33, where the auxiliary substrate optionally includes, a body portion extending generally alongside the primary substrate; and a top portion extending over at least a portion of the body portion and also extending beyond at least one side of the body portion, and over a portion of the primary substrate.

In Example 35, the subject matter of Example 34 optionally includes where the vertical thickness of the top portion is less than the vertical thickness of the semiconductor die.

Example 36 is a method of forming an auxiliary substrate for a microelectronic device having a primary substrate, including: forming a body portion of the auxiliary substrate, the auxiliary substrate formed with a first group of contacts proximate a lower surface in electrical communication with a second group of contacts proximate an upper surface of the body portion, the body portion having multiple sides extending between the lower surface and the upper surface; forming a top portion of the auxiliary substrate, the top portion extending over at least a portion of the body section and having an extension portion extending beyond at least one side of the body portion, the top portion including, a third group of contacts on an underside of the extension portion, and a redistribution layer having conductors coupling at least a portion of the contacts of the second group of contacts on the body portion to respective contacts of the third group of contacts.

In Example 37, the subject matter of Example 36 where at least a portion of the second and third contacts on the body portion are coupled by plated through hole vias.

In Example 38, the subject matter of any one or more of Examples 36-37, where the body portion and top portion are formed as a single structure.

In Example 39, the subject matter of Example 38 optionally includes forming multiple auxiliary substrates through forming of complementary portions having a common core substrate.

In Example 40, the subject matter of Example 39 optionally includes forming the material layers of multiple auxiliary substrates as a single unit, including, forming the material layers for the body portion as a symmetrical structure relative to a horizontal axis, forming the first and second groups of contacts and electrical connections between the contacts of the two groups symmetrically relative to the horizontal axis, a lateral axis and a vertical axis to form the body portion substrate; forming the material layers for the top portion of the auxiliary substrate over both upper and lower surfaces of the body portion substrate, including forming multiple conductive structures in contact with contacts in either the first or second groups of contacts and with contacts at a laterally offset location, where the material layers for the top portion formed over the upper surface and formed over the lower surface are formed complementary of one another relative to a vertical plane through the body portion substrate; separating the top portion material layers from the upper side of the body portion substrate in a first region to one side of the vertical plane; separating the body portion substrate along the vertical plane to form complementary body portions, each with the top portion extending beyond at least one side of the body portion.

In Example 41, the subject matter of Example 40 where the body portion substrate is separated along the vertical plane before forming of the material layers for the top portions.

Example 42 is a method of forming a microelectronic device, including coupling a semiconductor die to a primary substrate, the primary substrate including a first group of contacts on the first surface; coupling an auxiliary substrate to the primary substrate, including coupling contacts of a second group of contacts on the auxiliary substrate to contacts of the first group of contacts.

In Example 43, the subject matter of Example 42 where the auxiliary substrate is coupled to the primary substrate with a body portion of the auxiliary substrate extending alongside a generally vertical surface of the primary substrate, and with the top portion of the auxiliary substrate extending over the first surface of the primary substrate.

In Example 44, the subject matter of Example 43 where the body portion of the auxiliary substrate has a height essentially matching a height of the primary substrate, and where a top portion of the auxiliary substrate extends over the body portion and over a portion of the primary substrate.

In Example 45, the subject matter of any one or more of Examples 42-44, where the primary substrate includes a third group of contacts placed to contact a supporting structure, and where the auxiliary substrate includes a fourth group of contacts also placed to contact the supporting structure.

In Example 46, the subject matter of any one or more of Examples 42-45, further including coupling the first and second groups of contacts to one another through use of an anisotropic conductive film.

In Example 47, the subject matter of any one or more of Examples 42-45, further including coupling the first and second groups of contacts to one another through use of solder paste.

In Example 48, the subject matter of any one or more of Examples 42-47 optionally including: coupling a second semiconductor die to a third substrate, the third substrate including a fifth group of contacts on a primary surface; and coupling a sixth group of contacts on the auxiliary substrate in electrical communication with the fifth group of contacts.

In Example 49, the subject matter of Example 48 where the auxiliary substrate includes a top portion extending over at least a respective portion of each of the primary substrate and the third substrate.

Example 50 is an electronic system, including: a processor; a substrate assembly, including, a primary substrate, the processor coupled to a first surface of the primary substrate, the primary substrate including a first group of contacts on the first surface engaging contacts of the processor, and a second group of contacts on the first surface; and an auxiliary substrate coupled to the primary substrate, the auxiliary substrate having a third group of contacts coupled in electrical communication with the second group of contacts; and further including at least one memory device, and at least one of a mass storage device, a chipset, and a network interface.

In Example 51, the subject matter of Example 50 where the primary substrate comprises a fourth group of contacts on a second surface opposite the first surface, the fourth group of contacts placed to contact a supporting structure; and where the auxiliary substrate comprises a fifth group of contacts on a lower surface, the fifth group of contacts placed to contact the supporting structure.

In Example 52, the subject matter of any one or more of Examples 50-51, where the auxiliary substrate optionally includes a first portion extending alongside a generally vertical surface of the primary substrate, and a second portion extending over the first surface of the primary substrate.

In Example 53, the subject matter of any one or more of Examples 50-52, where the auxiliary substrate includes: a body portion having a height essentially matching a height of the primary substrate, and a top portion extending over the body portion and over a portion of the primary substrate.

In Example 54, the subject matter of any one or more of Examples 51-53, where the auxiliary substrate defines at least a first conductive path between a contact of the first group of contacts on the primary substrate and a contact of the fourth group of contacts on the auxiliary substrate; and where the auxiliary substrate defines at least a second conductive path between a contact of the fifth group of contacts on the third substrate and a contact of the fourth group of contacts on the auxiliary substrate.

In Example 55, the subject matter of any one or more of Examples 51-54, where the substrate assembly further includes a third substrate having a fifth group of contacts on an upper surface; where the auxiliary substrate defines at least a third conductive path between a contact of the first group of contacts on the primary substrate and a contact of the fifth group of contacts on the third substrate.

In Example 56, the subject matter of any one or more of Examples 51-54 optionally including a second semiconductor die coupled to a fifth group of contacts at an upper surface of the auxiliary substrate; and where the auxiliary substrate further includes a sixth group of contacts, with one or more of the sixth group of contacts coupled in respective electrical communication with contacts of the fifth group of contacts.

In Example 57, the subject matter of Example 56 where the auxiliary substrate defines a conductive path between a contact of the fifth group of contacts on the auxiliary substrate and a contact of the fourth group of contacts on the auxiliary substrate.

In Example 58, the subject matter of any one or more of Examples 56-57, where the auxiliary substrate defines a second conductive path between a contact of the first group of contacts on the primary substrate and a contact of the sixth group of contacts on the auxiliary substrate.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37

C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The invention claimed is:

1. A microelectronic device, comprising:

a semiconductor die;

a primary substrate, the semiconductor die coupled to a first surface of the primary substrate, the primary substrate including a first group of contacts on the first surface engaging contacts of the semiconductor die, and a second group of contacts on the first surface; and an auxiliary substrate coupled to the primary substrate, the auxiliary substrate having a third group of contacts coupled in electrical communication with the second group of contacts, the auxiliary substrate including a first portion that extends beside the primary substrate, the first portion having a first vertical thickness, and further including a second portion that extends above the first surface of the primary substrate and supports the third group of contacts, the second portion having a second vertical thickness, wherein the first vertical thickness is greater than the second vertical thickness.

2. The microelectronic device of claim 1, wherein the primary substrate comprises a fourth group of contacts on a second surface opposite the first surface, the fourth group of contacts placed to contact a supporting structure; and wherein the auxiliary substrate comprises a fifth group of contacts on a lower surface, the fifth group of contacts also placed to contact the supporting structure.

3. The microelectronic device of claim 2, wherein the fourth group of contacts and the fifth group of contacts each comprise contact balls.

4. The microelectronic device of claim 2, further comprising:

a second semiconductor die coupled to a third substrate, the third substrate including a sixth group of contacts on a primary surface; and wherein the auxiliary substrate further comprises a seventh group of contacts coupled in electrical communication with the sixth group of contacts.

5. The microelectronic device of claim 3, wherein the supporting structure includes a motherboard, and wherein the contact balls of the fourth and fifth groups of contacts are placed to contact the motherboard.

6. The microelectronic device of claim 4, wherein the auxiliary substrate comprises:

a body portion extending generally alongside the primary substrate and the third substrate, and a top portion extending beyond the body portion and over at least a respective portion of each of the primary substrate and the third substrate.

7. The microelectronic device of claim 4, wherein the primary substrate and the third substrate have approximately the same height.

8. The microelectronic device of claim 4, wherein the auxiliary substrate defines at least a first conductive path between a contact of the first group of contacts on the primary substrate and a contact of the fourth group of contacts on the auxiliary substrate; and wherein the auxiliary substrate defines at least a second conductive path between a contact of the fifth group of contacts on the third substrate and a contact of the fourth group of contacts on the auxiliary substrate.

9. The microelectronic device of claim 8, wherein the auxiliary substrate defines at least a third conductive path between a contact of the first group of contacts on the primary substrate and a contact of the fifth group of contacts on the third substrate.

10. The microelectronic device of claim 8, further comprising:

a second semiconductor die coupled to a fifth group of contacts at an upper surface of the auxiliary substrate; and wherein the auxiliary substrate further comprises a sixth group of contacts, with one or more of the sixth group of contacts coupled in respective electrical communication with contacts of the fifth group of contacts.

11. The microelectronic device of claim 1, wherein the auxiliary substrate comprises:

a first portion extending alongside a generally vertical surface of the primary substrate.

12. The microelectronic device of claim 1, wherein the auxiliary substrate comprises:

a body portion having a height essentially matching a height of the primary substrate, and a top portion extending over the body portion and over a portion of the primary substrate.

13. The microelectronic device of claim 1, wherein contacts of the second and third groups of contacts are electrically coupled to one another through use of an anisotropic conductive film.

14. The microelectronic device of claim 1, wherein contacts of the second and third groups of contacts are electrically coupled to one another through use of a solder paste.

* * * * *